United States Patent [19]

Wallace

[11] 4,358,323
[45] Nov. 9, 1982

[54] LOW COST REDUCED BLOOMING DEVICE AND METHOD FOR MAKING THE SAME

[75] Inventor: Lloyd F. Wallace, Coatesville, Pa.

[73] Assignee: RCA Corporation, New York, N.Y.

[21] Appl. No.: 340,775

[22] Filed: Jan. 19, 1982

Related U.S. Application Data

[62] Division of Ser. No. 143,026, Apr. 23, 1980, Pat. No. 4,329,702.

[51] Int. Cl.³ .................... H01L 27/14; H01L 21/263
[52] U.S. Cl. .................................... 148/1.5; 148/187; 357/31; 357/91; 427/43.1
[58] Field of Search .................... 148/1.5, 187; 357/31, 357/91; 427/43.1, 53.1

[56] References Cited

U.S. PATENT DOCUMENTS

| | | | |
|---|---|---|---|
| 3,676,727 | 7/1972 | Dalton et al. | 313/66 |
| 3,810,796 | 5/1974 | Skaggs et al. | 156/8 |
| 3,888,701 | 6/1975 | Tarneja et al. | 148/1.5 |
| 3,895,430 | 7/1975 | Wilson et al. | 29/584 |
| 4,047,976 | 9/1977 | Bledsoe et al. | 148/1.5 |
| 4,228,446 | 10/1980 | Kramer | 357/31 |
| 4,232,245 | 11/1980 | Savoye et al. | 313/367 |

FOREIGN PATENT DOCUMENTS 1337206 11/1973 United Kingdom.

OTHER PUBLICATIONS

"High Light Level Blooming in Silicon Vidicons", E. C. Douglas, IEEE Trans. on Electron Devices, vol. ED-22, pp. 224-234, May, 1975.

"Theory, Design, and Performance of Low-Blooming Silicon Diode Array Imaging Targets", B. M. Singer et al., IEEE Trans. on Electron Devices, vol. ED-21, pp. 84-89, Jan., 1974.

*Primary Examiner*—Upendra Roy
*Attorney, Agent, or Firm*—Eugene M. Whitacre; Dennis H. Irlbeck; Vincent J. Coughlin, Jr.

[57] ABSTRACT

An image sensing device includes a wafer having a first input sensing surface region and a second charge storage surface region. A recombination layer extends along the first surface and is spaced therefrom. The method for forming the recombination layer is also disclosed.

3 Claims, 2 Drawing Figures

LOW COST REDUCED BLOOMING DEVICE AND METHOD FOR MAKING THE SAME

This is a division of application Ser. No. 143,026, filed Apr. 23, 1980, now U.S. Pat. No. 4,329,702.

BACKGROUND OF THE INVENTION

This invention relates to a sensing device incorporating a single crystal semiconductor wafer and more particularly to a sensing device having a low cost, reduced blooming target.

Sensing devices such as silicon vidicons and silicon intensifier tubes employ sensing elements or targets comprising single crystal silicon wafers. The operation of such sensing elements in these devices is well known in the art. The phenomenon of blooming, common in silicon targets, is described in detail in "High Light-Level Blooming in the Silicon Vidicon" by E. C. Douglas, in "*IEEE Trans. on Electron Devices,*" Vol. ED-22, pages 224–234, May 1975 and incorporated by reference herein. Attempts to control blooming in such devices are described in "Theory, Design, and Performance of Low-Blooming Silicon Diode Array Imaging Targets" by B. M. Singer and J. Kostelec in "*IEEE Trans. on Electron Devices,*" Volume ED-21, pages 84–89, January 1974. Blooming Control in the Singer reference is achieved by forming an N+ potential barrier by ion implantation of phosphorous on the light input side of the silicon target. Blooming control as taught by Singer et al. exhibits uncontrollable variations and instabilities of dark current and blooming control performance.

Recently, improvements have been made in reducing and stabilizing the blooming effects of these targets as described in a copending patent application, Ser. No. 838,713, filed Oct. 3, 1977 by Savoye et al., entitled, "Reduced Blooming Devices", now U.S. Pat. No. 4,232,245 issued on Nov. 4, 1980, assigned to the same assignee as the present application, and incorporated by reference herein. As described in the aforementioned application, the blooming characteristics of the target are reduced by the ion implantation of an N+ potential barrier spaced less than about 1500 Å from the light input surface. The blooming characteristics are stabilized by depositing a passivating layer of boron-containing silica glass onto the input signal sensing surface of the silicon target.

The quantum efficiency of the aforementioned target has been enhanced by coating the passivating layer with a material which, in combination with the passivating layer, forms an antireflective region having an optical thickness substantially equal to an odd multiple of a quarter wavelength of the light incident on the device. Such a structure is described in a copending patent application, Ser. No. 037,832, filed May 10, 1979 by W. M. Kramer, entitled, "Reduced Blooming Device Having Enhanced Quantum Efficiency", now U.S. Pat. No. 4,228,446 issued on Oct. 14, 1980 assigned to the same assignee as the present application and incorporated by reference herein.

The silicon target structures described in both the Savoye et al. patent application and the Kramer patent application provide a high performance, reduced blooming target; however the cost of such a target is significant. Targets having ion implanted potential barriers such as those produced by the methods described in the Sayove et al. application have relatively low manufacturing yields because of cosmetic defects, such as white spots, which are caused by inadequate surface cleaning techniques and because of the requirement that the ion implanted potential barrier have a doping profile with the peak of the dopant concentration being located less than about 1500 Å from the input surface of the target.

In order to produce a low cost, reduced blooming target it is necessary to either improve the manufacturing yield of targets produced by the above described process, or to simplify the target processing while maintaining adequate blooming control. In certain applications high performance reduced blooming targets such as those described in Savoye et al. and the Kramer patents are not required and targets having good or adequate blooming control are desirable.

Such a target is described in British Pat. No. 1,337,206 to Ohkubo et al. published Nov. 14, 1973, and entitled, "Silicon Target for Image Pick-Up Tube". The aforementioned patent describes a silicon target structure without an ion implanted potential barrier, but having a plurality of periodic regions on the light input side of the target for recombining minority carriers generated by the projection of light onto the silicon target. These recombination regions reduce blooming by causing laterally diffusing minority carriers to recombine before they can discharge adjacent diodes on the scanned side of the target. The recombination regions are disclosed to be produced by ion implantation and cover approximately 20% of the light incident surface. An N+ region is subsequently formed on the light input side of the target by diffusion. The patentees claim that a reduction in sensitivity occurs if the recombination regions exceed about 20% of the total area of the light incident surface. The reduction in sensitivity is allegedly caused by the presence of the recombination regions.

A problem caused by the presence of the periodic recombination regions disclosed by the patentees is that under no light, or low light illumination the periodic pattern of the recombination regions can appear in the dark current output of the tube and form an objectionable pattern when displayed on a monitor. Such a pattern is objectionable and must be eliminated without sacrificing blooming control or further reducing target sensitivity.

Another method for reducing blooming is described in U.S. Pat. No. 3,895,430 to Wilson et al. issued on July 22, 1975, and entitled, "Method for Reducing Blooming in Semiconductor Array Targets." The Wilson et al. patent describes a method for forming recombination sites between the diodes by irradiating the diode side of the target with electrons, ions or photons and using the diode caps as a mask. The recombination sites located between adjacent diodes exist at the interface between the substrate and the insulation layer and therefore are less effective in controlling blooming than recombination sites located within the wafer.

SUMMARY OF THE INVENTION

An image sensing device includes a wafer having a first input sensing surface region and a second charge storage surface region. A recombination layer extends along the first surface and is spaced therefrom.

DETAILED DESCRIPTION OF THE PREFERRED EMBODIMENT

Figure 1:
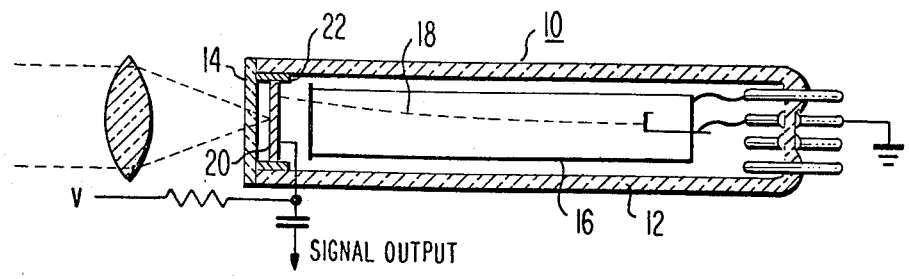
FIG. 1 is a longitudinal sectional view of an improved vidicon camera tube using the novel sensing element.

A preferred embodiment of the present novel structure is a vidicon camera tube 10, as shown in FIG. 1, having an evacuated envelope 12 and including a transparent faceplate 14 at one end of the envelope 12. An electron gun assembly 16 inside the envelope 12 forms a low velocity electron beam 18. An input signal sensing element or target 20, mounted on a metallic spacer 22, is positioned adjacent to the inside surface of the faceplate 14 in a manner suitable for receiving a light input image signal. Means (not shown) for magnetically focusing the beam 18 onto the target 20 and for causing the beam 18 to scan the surface of target 20 may be disposed outside the envelope 12.

Figure 2:
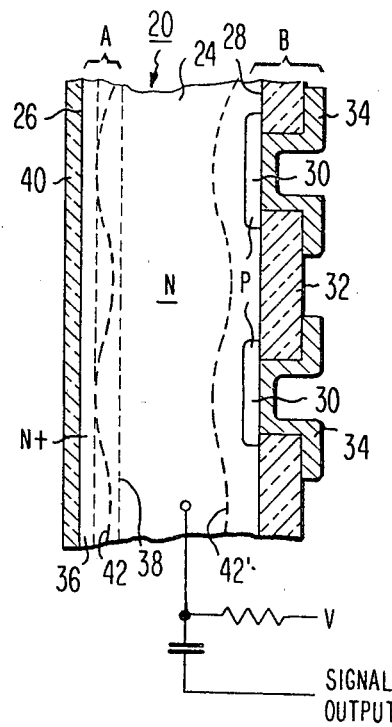
FIG. 2 is an enlarged fragmentary sectional view of the sensing element or target of the tube of FIG. 1.

The photon-excitable target 20, a fragment of which is shown in FIG. 2, is a silicon wafer 24, having an N type bulk region of a single crystal of elemental silicon with first and second opposed major surfaces 26 and 28, respectively. The first major surface 26 comprises the input signal sensing surface of the target 20 for receiving an input light image. The second major surface 28 faces the electron beam, when mounted in the tube in FIG. 1, and is referred to, for simplicity, as the scanned surface 28 of wafer 24.

The wafer 24 includes a charge storage region "B" along a surface portion including the scanned surface 28, and an input sensing region "A" along the surface portion including the input signal sensing surface 26. The charge storage region "B" includes, at the scanned surface 28 of the silicon wafer 24, an array of discrete PN junction storage diodes 30. An insulating layer 32 of silicon dioxide is provided on the scanned surface 28 between the discrete diodes 30 to shield the bulk of the wafer 24 from the effects of the scanned electron beam 18. Contact pads 34 of P type silicon are provided which cover the P type surface of the discrete diodes 30 and overlap the insulating layer 32 about the periphery of the diode 30 in a manner well known in the art. Such pads 34 improve contact of the scan beam 18 with the diodes 30. In the manufacture of the target 20 the charge storage region "B" may be fabricated in the manner fully described in U.S. Pat. No. 3,548,233 issued to E. F. Cave et al. on Dec. 15, 1970 and herein incorporated by reference.

An N+ potential region 36 is diffused into the wafer 24 for a distance of about 300 Å from the input signal sensing surface 26 in a manner well known in the art. The N+ layer at the imaging side of the target is a layer of enhanced conductivity, well known in the art, utilized to create a field which drives the holes towards the electron beam scanned side of the target and prevents recombination of holes at the imaging side of the target.

According to the present novel structure, it has been found that blooming control can be effectively and inexpensively achieved by implanting a recombination layer 38 along the input signal sensing surface 26 of the wafer 24 within the input signal sensing region "A". A wafer 24, complete in all respects except that an antireflective coating 40 has not yet been deposited on the sensing surface 26 is irradiated on the input sensing surface 26 with a beam of 80–110 keV protons (i.e. hydrogen ions, $H_1+$) for a sufficient time to cause about $4.5 \times 10^{15}$ to $5.6 \times 10^{15}$ protons per square centimeter to fall on the wafer 24. This radiation is sufficient to disturb the silicon lattice and introduce certain structural imperfections, such as dislocations, which cause the formation of recombination centers along the recombination layer 38 which is spaced about 0.9 to 1.1 microns from the input signal sensing surface 26.

The wafer 24 is then annealed by placing the wafer in a 500° C. oven having a hydrogen atmosphere for about 5 minutes or until the wafer reaches 325° C. The annealing process diffuses the hydrogen through the silicon lattice without annealing out the recombination center along recombination layer 38.

The wafer 24 is cooled in a hydrogen atmosphere for about 10 minutes and flushed in a nitrogen atmosphere for about 1 minute. The silicon oxide antireflective layer 40 may be applied in a manner well known in the art so as to increase the quantum efficiency of the target 20.

THEORY OF OPERATION

The crystalline structure of the silicon near the image sensing surface 26 is disrupted by proton implantation at a depth where surface variations do not affect the blooming control. Protons are implanted with an energy at which the atomic structure of the silicon becomes perturbed and a damage region comprising recombination centers is produced. Subsequent heat treatments at relatively low temperatures redistribute the protons, i.e., hydrogen ions, and leave a disrupted lattice region comprising the recombination layer 38. The annealing process is also required to reduce the dark current of the target 20. The diffused N+ region 36 is disposed between the recombination layer 38 and the image sensing surface 26 to prevent recombination of minority carriers, which are holes in N type silicon, at the surface.

During operation of the tube 10, voltages from a source (not shown) are applied across the target 20 as well as to the other tube elements in a manner well known in the art. With no radiation incident on the target, the electron beam 18 maintains a negative charge on the P type pads 34, and the diodes 30 are reversed biased creating a depletion region 42. Under ordinary light levels where the edge of the depletion region 42 extends almost to the edge of the N+ region 36, an electric field is coextensive with the depletion region and sweeps the minority carriers created by the incident radiation across the recombination layer 38 and toward the scanned surface 28 to discharge the depletion region 42. Under high light levels, however, the depletion region has been discharged by the minority carriers and has contracted to form the depletion region 42'. The recombination layer 38 is now disposed between the input surface 26 and the edge of the depletion region 42' so that the recombination layer 38 acts as a sink for excess holes that are generated under high light levels and diffuse laterally through the bulk of the target.

The present novel target structure, while slightly reduced in short wavelength sensitivity, i.e., in the blue region of the spectrum, shows adequate overall sensitivity and increased long wavelength sensitivity when compared to targets not having a proton induced recombination layer 38.

In the present structure the quantum efficiency can be further improved by forming an antireflection coating 40, preferably of silicon oxide, along the light input sensing surface 26.

Although described in the preferred embodiment of a silicon vidicon target, it should be noted that the ion implanted recombination layer disclosed above may also be applicable to solid state devices such as charge coupled devices and charge imaging devices.

What is claimed is:

1. A method for controlling blooming in an image sensing device comprising the steps of:
   preparing a silicon wafer of a first type conductivity, said wafer having first and second major surfaces;
   forming an insulating layer on the second major surface of said wafer;
   etching a plurality of apertures through said insulating layer;
   forming a plurality of regions of a second conductivity type through said apertures;
   forming an enhanced conductivity region along said first major surface extending into said wafer; and
   implanting protons into the first surface of said wafer, said protons having an energy of about 80–110 keV so as to provide a dosage of approximately $4.5-5.6 \times 10^{15}$ protons per square centimeter to establish a recombination layer spaced from said first surface.

2. The method as in claim 1, further including the step of annealing said wafer so as to diffuse the protons through said wafer.

3. The method as in claim 2, further including the step of forming, at a reduced temperature, an antireflection coating on the first surface of said wafer.

* * * * *